(12) United States Patent
Grimm

(10) Patent No.: US 10,317,494 B2
(45) Date of Patent: Jun. 11, 2019

(54) METHOD AND SYSTEM FOR GENERATING A MAGNETIC RESONANCE IMAGE

(71) Applicant: Siemens Aktiengesellschaft, Munich (DE)

(72) Inventor: Robert Grimm, Nuremberg (DE)

(73) Assignee: Siemens Aktiengesellschaft, Munich (DE)

(*) Notice: Subject to any disclaimer, the term of this patent is extended or adjusted under 35 U.S.C. 154(b) by 804 days.

(21) Appl. No.: 14/940,385

(22) Filed: Nov. 13, 2015

(65) Prior Publication Data

US 2016/0139223 A1    May 19, 2016

(30) Foreign Application Priority Data

Nov. 13, 2014   (DE) .................. 10 2014 223 149

(51) Int. Cl.
  *G01R 33/48*   (2006.01)
  *G01R 33/56*   (2006.01)

(52) U.S. Cl.
  CPC ..... *G01R 33/5608* (2013.01); *G01R 33/4824* (2013.01)

(58) Field of Classification Search
  CPC .................. G01R 33/5608; G01R 33/4824
  USPC ........................................................ 324/309
  See application file for complete search history.

(56) References Cited

U.S. PATENT DOCUMENTS

| 6,281,681 B1* | 8/2001 | Cline ............... G01R 33/54 324/307 |
| 2005/0264287 A1 | 12/2005 | Griswold et al. |
| 2010/0039110 A1 | 2/2010 | Takahashi et al. |
| 2013/0279786 A1 | 10/2013 | Lin et al. |

FOREIGN PATENT DOCUMENTS

| CN | 103399285 A | 11/2013 |
| CN | 103529413 A | 1/2014 |

OTHER PUBLICATIONS

Brummer et al., "Noquist: Reduced Field-of-View Imaging by Direct Fourier Inversion," Magnetic Resonance in Medicine, vol. 51, pp. 331-342 (2004).
Devaraj et al, "Elliptical Field-of-View PROPELLER Imaging," Magnetic Resonance in Medicine, vol. 62, pp. 808-814 (2009).
Larson et al., "Anisotropic Field-of-Views in Radial Imaging," IEEE Trans. on Medical Imaging, vol. 27, No. 1, pp. 47-57 (2008).
Jackson et al., "Selection of a Convolution Function for Fourier Inversion Using Gridding," IEEE Trans. on Medical Imaging, vol. 10, No. 1, pp. 473-478 (1991).

(Continued)

*Primary Examiner* — Jay Patidar
(74) *Attorney, Agent, or Firm* — Schiff Hardin LLP

(57) ABSTRACT

In a method and system for generating a magnetic resonance image, a raw data record with non-Cartesian recorded data points is provided to a processor, and the recorded data points are gridded on a Cartesian grid to form transformed data points, wherein the number of transformed data points is selected in at least one k-space direction such that the field of view is reduced in size, and Fourier transformation of the transformed data points is implemented to form a magnetic resonance image with a field of view as the raw data record that is smaller in at least one direction.

15 Claims, 5 Drawing Sheets

(56) References Cited

OTHER PUBLICATIONS

King, "Spiral Scanning with Anisotropic Field of View," Magnetic Resonance in Medicine, vol. 39, pp. 448-456 (1998).
Scheffler et al., "Reduced Circular Field-of-View Imaging," Magnetic Resonance in Medicine, vol. 40, pp. 474-480 (1998).
Breuer et al., "Zigzag Sampling for Improved Parallel Imaging," Magnetic Resonance in Medicine, vol. 60, pp. 474-478 (2008).
Beatty et al., "Rapid Gridding Reconstruction With a Minimal Oversampling Ratio," IEEE Trans. on Medical Imaging, vol. 24, No. 6, pp. 799-808 (2005).

* cited by examiner

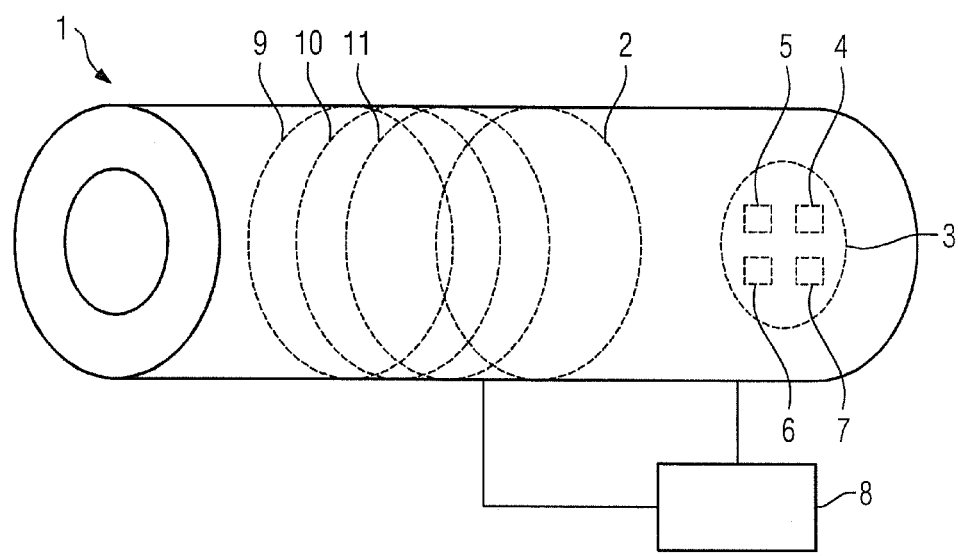
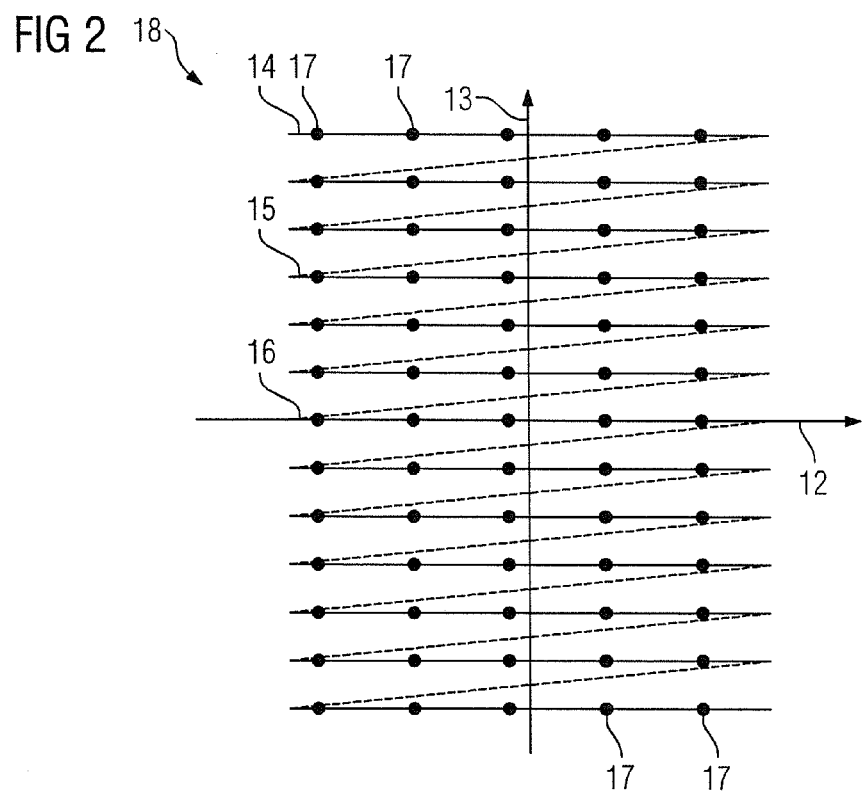

METHOD AND SYSTEM FOR GENERATING A MAGNETIC RESONANCE IMAGE

BACKGROUND OF THE INVENTION

Field of the Invention

The present invention concerns a magnetic resonance method and system for generating a magnetic resonance image data record from a raw magnetic resonance data record with non-Cartesian data points.

Description of the Prior Art

In magnetic resonance tomography, a number of spatially encoded individual signals are recorded, in order to produce an image therefrom. A number of so-called post-processing steps are required, including a Fourier transformation of the acquired data in order to generate image data that constitutes a collection of data.

The detected signals are entered at points in a memory called k-space. For many imaging sequences, it is usual to enter the acquired data at respective k-space points in lines, so-called k-space lines. It is also possible to record k-space points individually, until, represented diagrammatically, all points of a rectangular, symmetrical grid are scanned. This type of data acquisition is referred to as Cartesian scanning or recording.

This procedure is disadvantageous particularly with point-by-point scanning of k-space, because it is time-consuming. It is also known to scan k-space spirally or radially. Here, a higher information density is obtained in the central region of k-space than in the peripheral areas. The central k-space lines make the highest contribution to the image contrast and the outer k-space lines make the highest contribution to the resolution, in other words showing the finer structures. Acceleration of the data acquisition results in a loss of information in the outer areas of k-space.

In order to be able to Fourier transform the spiral-shaped or radial k-space data to form a meaningful image data record, particularly using the accelerated Fourier transformation FFT, it is necessary to transfer k-space data into a Cartesian grid. This process is referred to as gridding or regridding. With gridding, the Cartesian k-space points are obtained according to the following formula:

$$M_{cart}(x,y) = \{[(M*S*W) \otimes C]*R\} \otimes^{-1} C$$

Here "M" refers to the magnetization of k-space, "S" the recording coordinates, "W" a weighting function, "C" a convolution (convolving) function and "R" the Cartesian grid.

Here the data of Cartesian k-space are eventually obtained by the adjacent, recorded data points being weighted and interpolated.

The weighting function defines how the measured k-space data flows into the calculated k-space data in order to balance the varying sampling density. The weighting function can be obtained for instance from the sampling coordinates "S" and the convolution function "C", see Jackson et al. Selection of convolution function for Fourier Inversion using gridding. IEEE Trans Med Imaging 1991; 10: 473-480:

$$W = \frac{1}{\rho} = \frac{1}{S \otimes C}$$

In contrast, for interpolation purposes, a folding with a window function is performed. A known window function is the Hamming window. It is to be chosen in such a way that the Cartesian grid has no holes, but data points that are not too remote are taken into account.

In the two-dimensional case, the Cartesian grid is defined as:

$$R(x,y) = \sum_i \sum_j \delta(x-i, y-j)$$

The projection thus results:

$$M_{cart}(x,y) = M_{conv}(x,y) \cdot R(x,y)$$

Once all steps of the gridding are completed, k-space with calculated or transformed Cartesian data points instead of radially or spirally distributed data points is achieved. The data can then be further processed with known post-processing steps such as baseline correction, zero filling, FFT, etc.

To avoid aliasing artifacts, it is necessary to position the field of view (FoV) such that the entire object to be examined is detected. Otherwise, foldovers occur. This means that more data than are actually necessary must be recorded, because normally only a limited area of the examination object is of interest. This additional data must be processed until an image is available. As a matter of course, areas can then be selected for representation in the image. Each is known as a region of interest or ROI. With three-dimensional data, such regions are each called a volume of interest or VOI.

To optimize the acquisition of data, it is known to define the FoV and the number of k-space data points separately for each spatial direction. Moreover, the read direction is often positioned in the direction of the longest spatial extent in order to minimize the recording time. For instance, elongated examination objects enable k-space lines to lie in the direction of the longest extent.

With spiral trajectories, it is also known to design the FoV anisotropically, cf. King K., Spiral Scanning with Anisotropic Field of View, MRM, 39:448-456, 1989. Here k-space trajectory is adjusted to the object geometry. This procedure is also known for radial trajectories (Scheffler and Hennig, Reduced Circular Field-of-View Imaging, MRM, 40, 474-480, 1988) and radial trajectories (Larson et al., Anisotropic Field-of-Views in Radial Imaging, IEEE Trans Med Imaging, 27 (1), 47-57, 1991).

With all these methods, an improvement in the recording efficiency alone depends on the examination object having a primary direction, and therefore an adjustment to the field of view is possible. It is nevertheless still necessary to record the entire examination object in the complete excited area, because otherwise foldovers occur. This is particularly problematic with larger data records and interventional operations, since this slows down the image reconstruction. It is also not possible with all recording methods to perform these optimizations with an acceptable amount of hardware or computing outlay.

SUMMARY OF THE INVENTION

An object of the present application is to provide a method for generating an MR image data record from a raw MR data record with non-Cartesian data points, which is accelerated compared to the prior art.

This object is achieved in accordance with the invention by a method for generating a magnetic resonance image that has the following steps.

A raw data record with non-Cartesian recorded data points is provided to a processor.

The recorded data points are gridded on a Cartesian grid to form transformed data points.

The number of transformed data points in at least one k-space direction is selected such that the field of view (FoV) is reduced in size.

The transformed data points are Fourier transformed to form a magnetic resonance image with a field of view that is smaller in at least one direction than the FoV in the raw data record.

The basis of the invention is the insight that processing of a non-Cartesian raw data record is accelerated such that, during gridding, the number of data points or lines is reduced in at least one direction of k-space. A spiral trajectory in all k-space directions is usually smaller or equal in size to the Cartesian grid calculated therefrom. Since the data points of a spiral are not distributed evenly, the number of data points in one direction cannot be readily specified.

Therefore the result achieved directly in this way is used to describe the calculation.

In the case of Cartesian coordinates that were calculated from non-Cartesian coordinates, k-space extends from a minimum to a maximum value:

$$-k_{max,cart.}(x) \leq k(x) \leq k_{max,non-cart.}(x)$$

$$-k_{max,cart.}(y) \leq k(y) \leq k_{max,non-cart.}(y)$$

and with a 3D recording additionally $$-k_{max,cart.}(z) \leq k(z) \leq k_{max,non-cart.}(z)$$

The resolution is defined in each case by way of the maximum k-values:

$$\Delta x = \frac{1}{k_{max}(x)}$$

This also applies to the y- and z-direction.

The field of view, abbreviated to FoV, which specifies the extent of the recording area, is defined in a Cartesian k-space by way of the distance of k-space lines:

$$FoV_{x,y,z} = \frac{1}{\Delta k_{x,y,z}}$$

The number of data points in one direction is accordingly specified by the number or the distance of the lines of k-space, which also defines the FoV.

A field of view also has the recorded raw data record, but this cannot be specified universally, since it provides a number of non-Cartesian recording strategies.

It is noted again that, in accordance with the invention, a reduction in k-space lines results in a smaller FoV and not in a reduced resolution, since $k_{max}$ remains at least essentially the same and only the distance of k-space lines is increased.

A number of scanning schemes can be used such as spiral trajectories or radial trajectories. Moreover, a non-Cartesian k-space can be Fourier transformed and the image obtained therefrom used to define the FoV in the image space.

In contrast to the prior art, in order to accelerate the image acquisition, a change is performed not on the recording sequence but instead on the processing of the recorded data.

The aforementioned definition of the FoV for Cartesian k-space applies respectively to the x, y and z-direction. Accordingly, an increase in the distance of k-space lines in one direction, namely x and/or y and/or z, results in each case in a reduction in size of the FoV in precisely this direction. A direct consequence of the described method is therefore that the FoV of k-space of the Cartesian grid, which is calculated from the non-Cartesian raw data record, is smaller than the FoV according to the prior art. However, measurement signals flow into the calculation of k-space points or k-space lines of the Cartesian grid, which were recorded with a larger FoV.

The number of transformed data points can be reduced in size in at least one direction, in which oversampling is present. The Nyquist theorem specifies a threshold, below which undersampling exists. If more than the required number of data points is recorded in order to achieve a predetermined resolution in one direction, oversampling exists.

The resolution was defined by the maximum k-value. This is not changed by the described procedure, since only the distance of k-space lines and not the maximum values are changed.

The number of transformed data points, with a constant $k_{max}$, or the FoV in the read direction can preferably be reduced in size. An oversampling without time loss is achieved in the read direction, which is why the reduction in k-space data preferably takes place in this k-space direction. The read direction is also referred to as a read direction.

In addition or alternatively, the number of data points transformed in the phase direction can be reduced in size. Similarly in addition or alternatively, the number of transformed data points can be reduced in size in the slice direction. In fact, a resolution impairment takes place in these directions. This is acceptable for certain situations, e.g. if the image resolution achieved is adequate for an interventional procedure. If it is necessary for other reasons to record the data records recorded in and of themselves with too high a resolution, e.g. because they are required for a slowed-down but high-resolution representation, the data of a data record can be processed once more quickly and with a lower resolution and once more slowly and with a high resolution. In the first instance, the inventive method is used.

The raw data record provided can preferably be generated with a coil array. The recording time can be reduced with a coil array.

A raw data record scanned in a spiral form can advantageously be used. The scanning of k-space on a spiral trajectory is a known type of non-Cartesian scanning. It is advantageous because the spiral form can be designed in many ways and is therefore very flexible.

Alternatively, a radially scanned raw data record can be used. In other words, the data present in the raw data record is distributed radially across k-space. This type of scanning of k-space is also known.

In comparison with the number of data points of the raw data record, the number of transformed data points can preferably be reduced in size to a ratio of standard numbers. If it is assumed that the maximum k-values of the measured and transformed k-space data in accordance with the prior art are essentially the same, this is to ensure a reduction in size to an easily manageable ratio. In particular, a ratio of $1:2^n$ can be used, wherein n is a natural number.

The number of transformed data points can preferably be halved in at least one direction by comparison with the number of data points of the raw data record. This applies if the limits of k-space, in other words the maximum k-values, were the same in the known case. Alternatively it is possible to transform the number of transformed data points compared with the number of recorded data points of the raw data record to the largest possible number 2n, in which $2^n < k_{max,non-Cart}$. If a Cartesian data record with 512 data points is generated from a non-Cartesian raw data record in one spatial direction, there are now 256 data points in the Cartesian data record. By halving the data points, the FFT can also be used, even if a double oversampling is fully utilized. The reconstruction time can be minimized as a result.

In order to automate the reduction in the transformed data points, it is important to automatically identify the directions in which a reduction in the data points and thus in the FoV is possible. Several possibilities are conceivable here:

The reduction factor can be determined in at least one direction on the basis of a Fourier transformation of a partial data record composed of a number of k-space lines of the raw data record. A type of thumbnail is thus created and evaluated. Here the reduction factor can be determined in at least one direction on the basis of a projection in this direction. During this the signal intensities of the image points are added in one direction. The central k-space lines are advantageously used here.

Alternatively, the reduction factor can be determined in at least one direction on the basis of a calibration measurement. The calibration measurement is also ultimately a projection measurement, nevertheless regardless of the raw data record.

In fact both a calibration measurement and also the creation of the thumbnail are associated with computing outlay. Nevertheless, with a repeated recording of the same examination region, for instance, this outlay need only be performed once and therefore barely carries any disadvantage.

Furthermore, the reduction factor can alternatively be determined in at least one direction on the basis of a Fourier transformation of a data record consisting of a single k-space line of the data record on transformed data points or measured data points. If the central k-space line of the raw data record is firstly transformed from transformed k-space points, this can be used to create a projection. Measured k-space points can also be used. For instance, with a radial scanning of k-space, lines can also be scanned in the x- and y-directions. No additional calibration measurement is then required, since the data is already present.

The object of the present invention is also achieved by a magnetic resonance system having a scanner that is operated by a control computer. The control computer is designed to implement the method as described above.

Implementation of the aforementioned method in the control apparatus can take place as software or as (hardwired) hardware.

BRIEF DESCRIPTION OF THE DRAWINGS

FIG. 1 shows a magnetic resonance system.
FIG. 2 shows a first k-space diagram.

DESCRIPTION OF THE PREFERRED EMBODIMENTS

Figure 3:
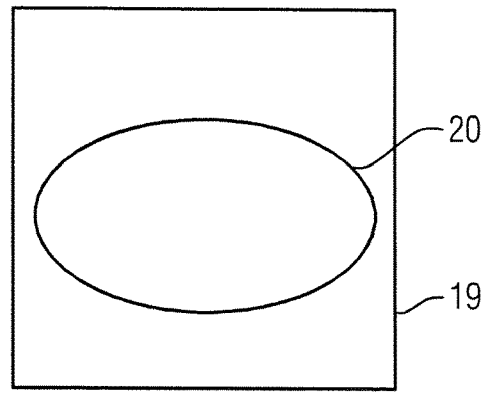
FIG. 3 shows a first magnetic resonance image.

FIG. 1 shows a magnetic resonance system 1. This system 1 has a radio-frequency coil 2 embodied as a body coil and a coil array 3 with coils 4, 5, 6 and 7 and a control computer 8. A body coil such as the coil 2 is used to excite the magnetization. The coil array 3 is by contrast provided to read out the measurement signal. The coils 4, 5, 6 and 7 of the coil array 3 simultaneously read out (detect) the measurement signal. An individual coil can also be used as a detection coil instead of the coil array 3.

With high-field devices with a field strength of greater than 10 T and a patient tunnel of 40 mm to 200 mm, coils are also distributed, which are at the same time the excitation and detection coil. The method described further below can also be implemented.

Gradient coils 9, 10 and 11 must be present on every tomography device. The gradient coils 9, 10 and 11 generate gradient fields in three directions. These are designed to with a, b and c. These are superimposed in order to generate the gradients used in a recording sequence, the gradients existing in the read, phase and slice directions. This means that the gradients used in a sequence are composed individually or in any combination, depending on their position, from the gradients in the directions a, b and c.

The gradient coils 9, 10 and 11 or the fields generated therewith are required for the spatial encoding. The repeated variation of at least one current feed value of one of the gradient coils 9, 10 and 11 scans k-space.

FIG. 2 shows a k-space diagram of a Cartesian-scanned k-space with two dimensions. $k_x$ is plotted against the axis 12, $k_y$ against axis 13. K-space has a number of lines in the $k_x$-direction, wherein the $k_x$-direction is the read direction in this representation.

K-space lines, for instance k-space lines 14, 15 and 16, each comprise a number of k-space points 17. Here the use of a number of $2^n$ k-space lines with $2^n$ k-space points 17, e.g. respectively 128, is usual. This produces a grid with $128^2$ points. K-space lines overall are also referred to as raw data record 18. The raw data record 18 in this case only consists of measured data points. K-space points 17 as data points of the raw data record 18 may have been recorded individually or in lines.

FIG. 3 shows a schematic representation of an image 19 reconstructed from FIG. 2, which shows a cross-sectional view of an abdomen 20 of a patient.

Figure 4:
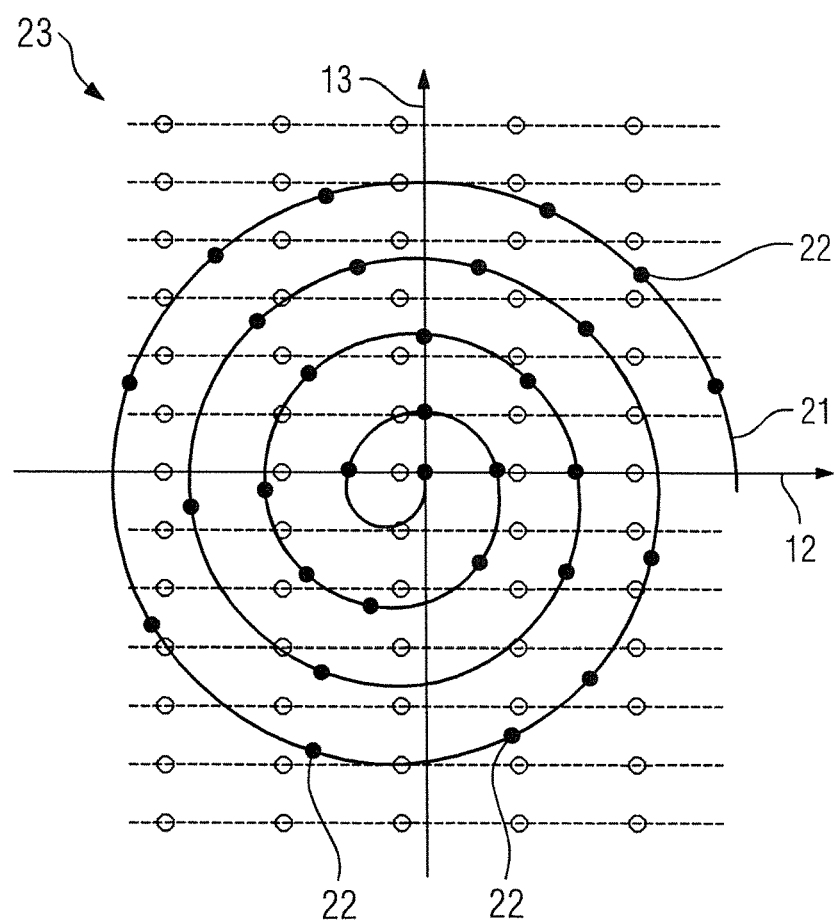
FIG. 4 shows a second k-space diagram.

FIG. 4 shows k-space scanned with a spiral trajectory 21. K-space points 22 lie on this spiral trajectory 21. In order to represent the ratios of the maximum k-values, the Cartesian scanned k-space from FIG. 2 is shown with a line underneath. The maximum k-value achieved in the direction of axes 12 and 13 is comparable, but the lower the scanning density, the higher the k-values in each case. K-space points 22 are also acquired data points. The totality of k-space points 22 is referred to as raw data record 23.

Figure 5:
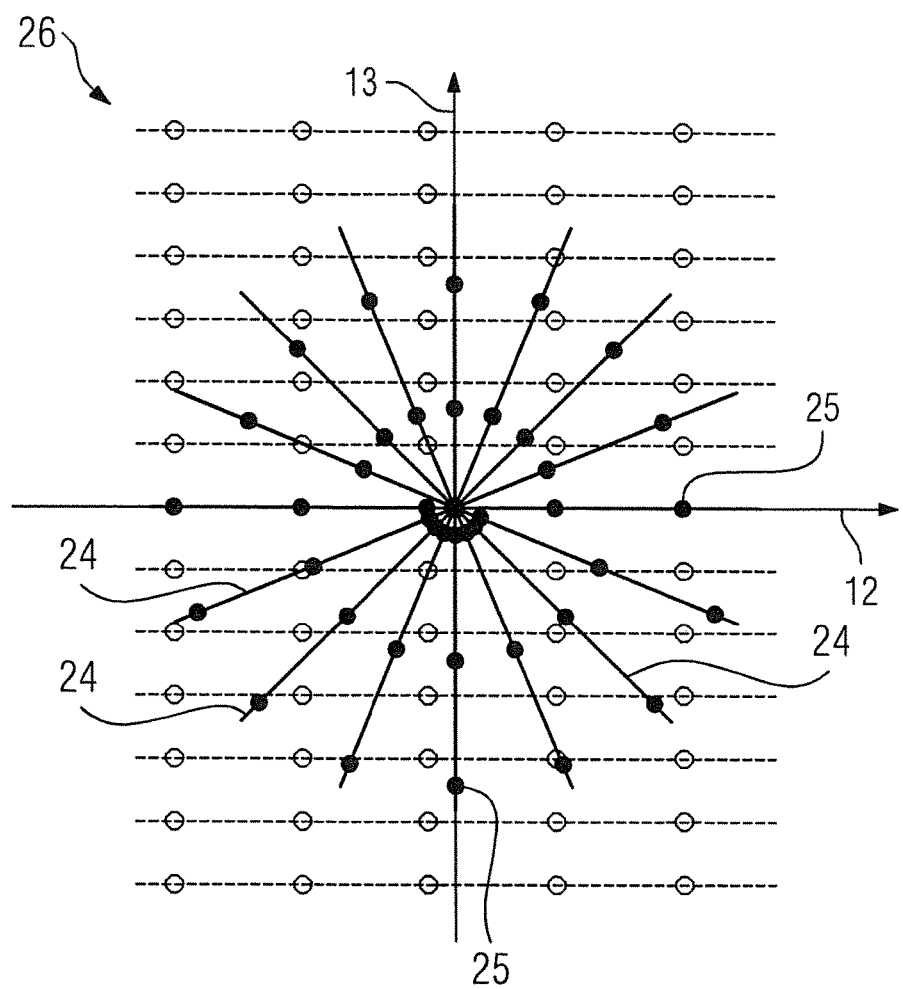
FIG. 5 shows a third k-space diagram.

FIG. 5 shows a radially scanned k-space. The respectively recorded radial trajectories 24 include k-space points 25. Even with this scanning scheme the sampling density in the center in k-space is higher than in the boundary areas. The totality of k-space points 25 is referred to as raw data record 26. Irrespective of the rotation, the radial trajectories 24 are recorded here with the same parameters, the raw data record obtained therefrom is therefore square.

Moreover further non-Cartesian scanning schemes exist for k-space. Zig-zag scanning is known, which is used in particular when using coil arrays, cf. Breuer et al, Zigzag sampling for improved parallel imaging, MRM, 60(2), 474-478, 2008. Non-Cartesian within the meaning of the present application are all scanning schemes which render a gridding necessary, in other words a transformation to a Cartesian grid, in order to be about to Fourier transform the data with a rapid Fourier transformation FFT.

Figure 6:
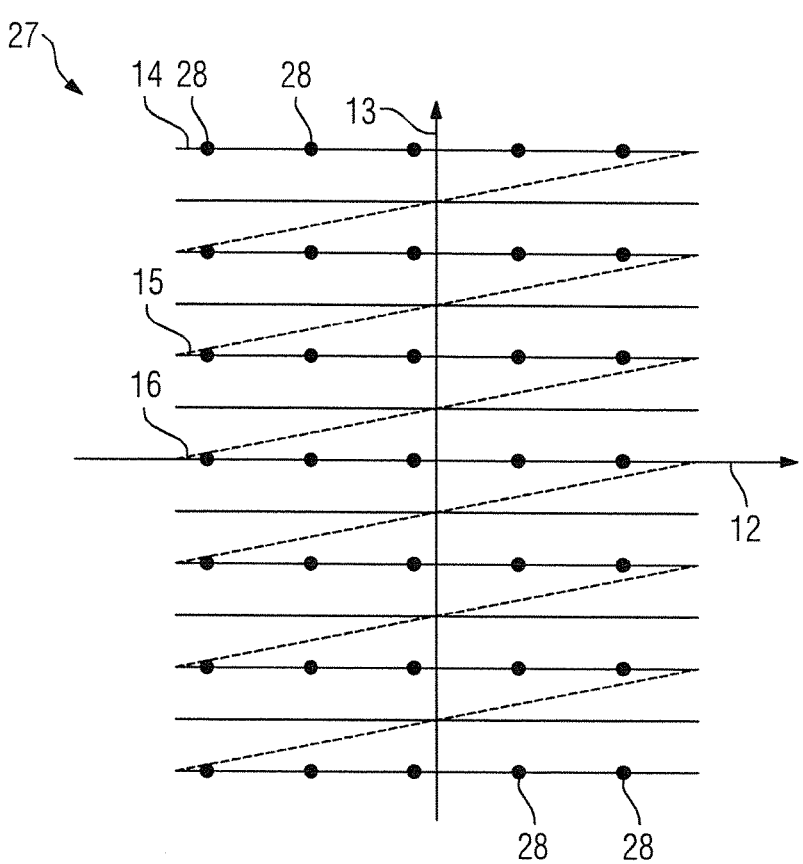
FIG. 6 shows a fourth k-space diagram.

FIG. 6 shows a Cartesian k-space or raw data record 27, which is obtained when the described method is performed. The data points of k-space are therefore k-space points 28 calculated or transformed for instance from the raw data record 23 or 26. If a reduction factor is used in the x-direction, only half as many k-space lines are obtained. With this gridding, the weighted and folded data is not transformed onto a grid R (x,y) but instead onto a grid R($a_x$*x, $a_y$*y), wherein $a_x$=0.5 and $a_y$=1. Here it is not the maximum $k_g$-value that is changed but instead only the distance □$k_x$.

Figure 7:
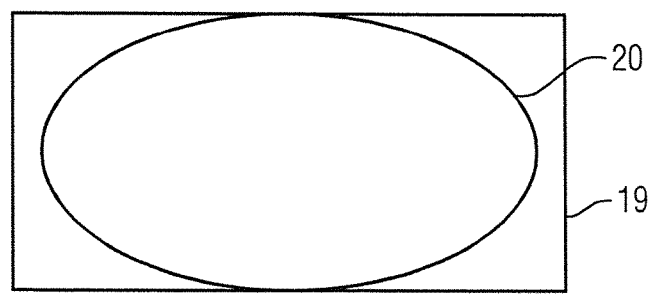
FIG. 7 shows a second magnetic resonance image.

Accordingly, the image 29 reconstructed from the raw data record 27 shown in FIG. 6, which is shown in FIG. 7, is reduced in size in the read direction.

Figure 8:
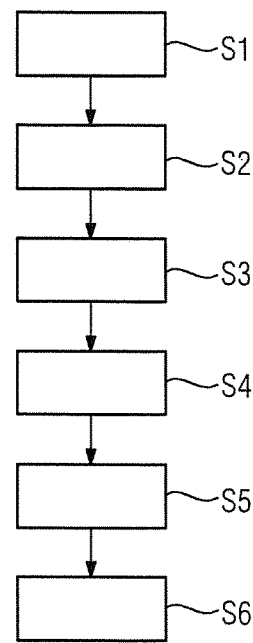
FIG. 8 is a flowchart to generate a magnetic resonance image in accordance with the invention.

FIG. 8 shows a flowchart of a method for generating a magnetic resonance image.

In step S1, a raw data record 23 or 26 is provided with non-Cartesian recorded data points 22 or 25. This can take place by means of the previous recording or retrieval from a memory. The recorded signal $M_s$ or a k-space point 22 or 25 are provided here by way of the product from the magnetization M and the recording location S:

$$M_s(x,y)=M \cdot S(x,y)$$

The gridding of the data points then takes place in steps S2 to S5.

In step S2, the weighted signal $M_w$ is determined from the recorded signal $M_s$ by the weighting function W:

$$M_w(x,y)=M_s(x,y) \cdot W(x,y)=M \cdot S(x,y) \cdot W(x,y)$$

The varying sampling density can be corrected by way of the weighting function W. With this weight, only the values on the recording points are changed, the remaining k-space is nevertheless empty until then.

In order to fill k-space at the empty positions, a folding is performed with a convolution function C in step S3:

$$M_c(x,y)=M_w(x,y) \otimes C(x,y)$$

A Hamming window can be used, as described, as a folding function.

In the following step S4, the folded signal is multiplied with a grid or a grid function R(x, y), wherein the field of view (FoV) is reduced in size compared with the recorded signal Ms. This takes place by increasing the distance of k-space lines:

$$M_{carl}(x,y)=M_c(x,y) \otimes R(\alpha_x \cdot x, \alpha_y \cdot y)$$

Here at least one of the factors $\alpha_x$ and $\alpha_y$<1 is selected so that the distance of k-space lines is increased.

In step S5, post-processing steps such as baseline correction or zero filling can be performed, before in step S6 a Fourier transformation of the transformed data points 28 takes place to form a magnetic resonance image 29.

Figure 9:
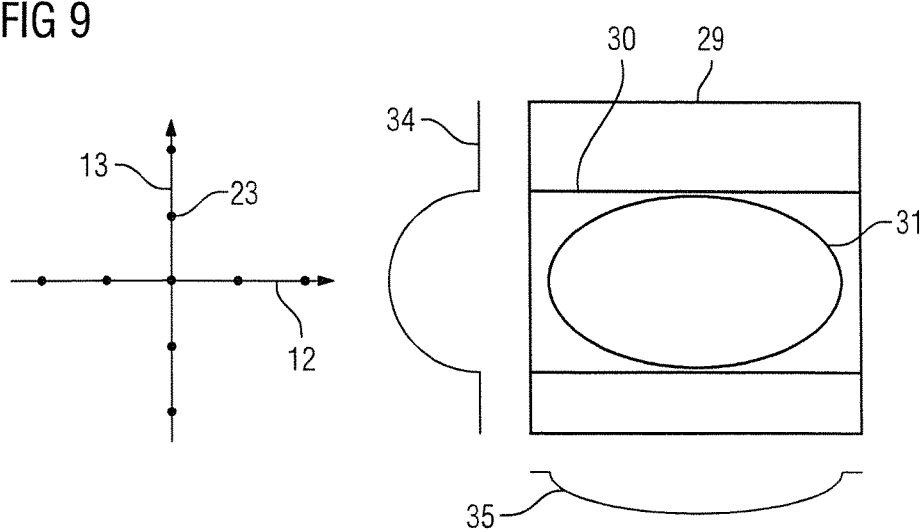
FIG. 9 shows the determination of a bounding box around an examination object.

FIG. 9 shows a possibility for determining a reduction factor with a bounding box 30 for an examination object 31. Here two k-space lines 32 and 33 are recorded in the x- and y-directions and Fourier transformed, as a result of which the signal curves 34 and 35 are obtained. The bounding box 30 can then be obtained from the signal curves 34 and 35 by way of signal threshold values for instance. The recording of the two k-space lines 32 and 33 only requires a few milliseconds and can be used for all measurements without moving the examination object 31. Whether a bounding box 31 is used is ultimately insignificant, this nevertheless represents the part to be displayed.

The reduction factors $\alpha_x$ and $\alpha_y$ can then be determined with the aid of the bounding box 30.

With a radial scanning of k-space as shown in FIG. 4, k-space lines 32 and 33 are in most instances automatically obtained, as a result of which no additional measurements are required.

With an alternative scanning of k-space, the signal curves 34 and 35 can also be obtained in the read and phase direction or x- and y-directions by projection of the examination object 31 in the magnetic resonance image 29. A Cartesian k-space must therefore firstly be calculated, in which k-space line distances are not enlarged.

Although the description above in most instances describes two-dimensional data records, it is also possible to perform the described method in three dimensions.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance (MR) image, comprising:

operating an MR data acquisition scanner, comprising a plurality of gradient coils, so as to produce a raw data record, having a raw data record field of view and a resolution, comprising raw MR data acquired from a subject and entered respectively at a plurality of non-Cartesian data points in a memory organized as k-space, with k-space being organized in said memory so as to have a plurality of Cartesian directions defined by gradient magnetic fields produced by said plurality of gradient coils during the production of said raw data record;

providing a processor with said raw data record and, in said processor, gridding the non-Cartesian data points in said raw data record on a Cartesian grid in k-space that has said Cartesian directions, thereby forming gridded data points with a respective plurality of said gridded data points in each of said Cartesian directions;

in said processor, selecting a number of said gridded data points, in at least one direction of said Cartesian directions, which is less, by a reduction factor, than the respective plurality of gridded data points in said at least one direction, and thereby reducing a size of said field of view of said raw data record without reducing said resolution;

in said processor, applying a Fourier transformation to the respective plurality of gridded data points in all of said Cartesian directions except said at least one direction and, in said at least one direction, applying said Fourier transformation only to said number of gridded data points, so as to produce image data in a magnetic resonance image of the subject that has a smaller image field of view in said at least one direction due to said reduced size of the field of view of said raw data record; and making said image data available from said processor in electronic form, as a data file.

2. A method as claimed in claim 1 comprising selecting said at least one direction, in which said number of gridded data points is selected to be at least one direction of k-space in which an oversampling of said data points exists in said raw data record.

3. A method as claimed in claim 1 comprising operating said MR data acquisition scanner so as to generate said gradient magnetic fields in order to define said Cartesian directions as a phase direction and a slice direction and a read direction in k-space, and selecting said at least one direction to be said read direction.

4. A method as claimed in claim 1 comprising operating said MR data acquisition scanner so as to generate said gradient magnetic fields in order to define said Cartesian directions as a phase direction and a slice direction and a phase direction in k-space, and selecting said at least one direction to be said phase direction.

5. A method as claimed in claim 1 comprising operating said MR data acquisition scanner to generate said gradient magnetic fields in order to define said Cartesian directions as a phase direction and a slice direction and a read direction in k-space, and selecting said at least one direction to be said slice direction.

6. A method as claimed in claim 1 comprising generating said raw data record by operating said MR data acquisition scanner with a coil array to acquire said magnetic resonance data.

7. A method as claimed in claim 1 comprising operating said MR data acquisition scanner so as to enter said magnetic resonance data into k-space at respective data points in said memory along a spiral trajectory.

8. A method as claimed in claim 1 comprising operating said MR data acquisition scanner so as to enter said magnetic resonance data into k-space at respective data points in said memory along a radial trajectory.

9. A method as claimed in claim 1 comprising selecting said number of gridded data points so as to be a ratio of standard numbers of data points with respect to the respective plurality.

10. A method as claimed in claim 1 wherein said reduction factor is half of a total number of data points in said raw data record.

11. A method as claimed in claim 1 comprising determining said reduction factor in said processor in said at least one direction of k-space by a Fourier transformation of a selected number of lines in k-space in said raw data record.

12. A method as claimed in claim 1 comprising determining said reduction factor in at said least one direction from a projection along said at least one direction.

13. A method as claimed in claim 1 comprising determining said reduction factor in said at least one direction of k-space by a calibration measurement.

14. A method as claimed in claim 1 comprising determining said reduction factor in said at least one direction of k-space by a Fourier transformation of a single line of transformed data points in k-space.

15. A magnetic resonance (MR) apparatus comprising:
an MR data acquisition scanner comprising a plurality of gradient coils;
a computer configured to operate an MR data acquisition scanner so as to produce a raw data record having a raw data record field of view and a resolution, comprising raw MR data acquired from a subject and entered respectively at a plurality of non-Cartesian data points in a memory organized as k-space, with k-space being organized in said memory so as to have a plurality of Cartesian directions defined by gradient magnetic fields produced by said plurality of gradient coils during the production of said raw data record;
said computer being configured to grid the non-Cartesian data points in said raw data record on a Cartesian grid in k-space that has said Cartesian directions, thereby forming gridded data points with a respective plurality of said gridded data points in each of said Cartesian directions;
said computer being configured to select a number of said gridded data points, in at least one direction of said Cartesian directions, which is less, by a reduction factor, than the respective plurality of gridded data points in said at least one direction, and thereby reducing a size of said field of view of said raw data record without reducing said resolution;
said computer being configured to apply a Fourier transformation to the respective plurality of gridded data points in all of said Cartesian directions except said at least one direction and, in said at least one direction, to apply said Fourier transformation only to said number of gridded data points, so as to produce image data in a magnetic resonance image of the subject that has a smaller image field of view in said at least one direction due to said reduced size of the field of view of said raw data record; and
said computer being configured to make said image data available from said computer in electronic form, as a data file.

* * * * *